United States Patent
Ochiai et al.

(10) Patent No.: US 10,361,148 B1
(45) Date of Patent: Jul. 23, 2019

(54) LEADFRAME WITH EFFICIENT HEAT DISSIPATION FOR SEMICONDUCTOR DEVICE PACKAGE ASSEMBLY

(71) Applicant: SEMICONDUCTOR COMPONENTS INDUSTRIES, LLC, Phoenix, AZ (US)

(72) Inventors: Isao Ochiai, Ota (JP); Hiroshi Inoguchi, Tatebayashi (JP)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

(21) Appl. No.: 15/941,424

(22) Filed: Mar. 30, 2018

(51) Int. Cl.
*H01L 23/495* (2006.01)
*H01L 21/48* (2006.01)
*H01L 23/00* (2006.01)

(52) U.S. Cl.
CPC .... *H01L 23/49568* (2013.01); *H01L 21/4842* (2013.01); *H01L 23/49503* (2013.01); *H01L 24/48* (2013.01)

(58) Field of Classification Search
CPC ......... H01L 23/49568; H01L 23/49503; H01L 21/4842; H01L 24/48
See application file for complete search history.

(56) References Cited

U.S. PATENT DOCUMENTS 8,120,152 B2 *   2/2012   Chang Chien ...... H01L 21/4832
                                                           257/666
8,124,447 B2 *   2/2012   Chang Chien ...... H01L 21/4832
                                                           257/E21.502

FOREIGN PATENT DOCUMENTS

| JP | 2000277675 A | 10/2000 |
| JP | 2006066622 A | 3/2006 |
| JP | 2008171925 A | 7/2008 |

* cited by examiner

*Primary Examiner* — David Vu
(74) *Attorney, Agent, or Firm* — Brake Hughes Bellermann LLP (57) ABSTRACT

In a general aspect, a semiconductor device package assembly can include a first leadframe portion. The first leadframe portion can have a recessed region defined therein. The recessed region can have a sidewall and a bottom. The assembly can also include a second leadframe portion that is press-fit into the recessed region, such that a bottom surface of the second leadframe portion is in contact with the bottom of the recessed region. The second leadframe portion can be retained in the recessed region by mechanical force between an outer surface of the second leadframe portion and an inner surface of the sidewall, where the outer surface of the second leadframe portion can be in contact with the inner surface of the sidewall.

21 Claims, 12 Drawing Sheets

LEADFRAME WITH EFFICIENT HEAT DISSIPATION FOR SEMICONDUCTOR DEVICE PACKAGE ASSEMBLY

TECHNICAL FIELD

This description relates to semiconductor device package assemblies, and corresponding methods of manufacture. More specifically, this description relates to leadframes having efficient heat dissipation characteristics that can be included in semiconductor device package assemblies.

BACKGROUND

Heat dissipation efficiency (capability, etc.) is an important consideration in the design and development of semiconductor device packages assemblies, particularly for package assemblies that include power semiconductor devices, such as power metal-oxide-semiconductor field-effect transistors (MOSFETs), insulated-gate bipolar transistors (IGBTs), etc. Current approaches for providing efficient heat dissipation in semiconductor device package assemblies include the use of heat sinks and/or heat spreaders. Costs (material costs, manufacturing costs, etc.) associated with such approaches can be prohibitive in some implementations. For instance, in heatsink implementations, a cost of materials that is discarded during manufacturing (e.g., a support frame, etc.), which can referred to as loss cost, can undesirably increase an overall production cost of a corresponding packaged semiconductor device. For heat spreader implementations, manufacturing costs (e.g. costs associated with complex metallurgy processes) to produce leadframes with such heat spreaders can also undesirably increase overall production cost.

SUMMARY

In a general aspect, a semiconductor device package assembly can include a first leadframe portion. The first leadframe portion can have a recessed region defined therein. The recessed region can have a sidewall and a bottom. The assembly can also include a second leadframe portion that is press-fit into the recessed region, such that a bottom surface of the second leadframe portion is in contact with the bottom of the recessed region. The second leadframe portion can be retained in the recessed region by mechanical force between an outer surface of the second leadframe portion and an inner surface of the sidewall, where the outer surface of the second leadframe portion can be in contact with the inner surface of the sidewall.

In another general aspect, a semiconductor device package assembly can include a first leadframe portion. The first leadframe portion can have a recessed region defined therein. The recessed region can have a bottom and a sidewall, the bottom defining a plane, the sidewall being orthogonal to the plane. The assembly can also include a second leadframe portion that is press-fit into the recessed region, such that: a first portion of the second leadframe portion is disposed within the recessed region, and in contact with the sidewall and the bottom, and a second portion of the second leadframe portion is disposed outside the recessed region.

In another general aspect, a method can include forming a recessed region in a first leadframe portion. The recessed region can having a sidewall and a bottom. The method can also include press-fitting a second leadframe portion into the recessed region, such that a bottom surface of the second leadframe portion is in contact with the bottom of the recessed region. The second leadframe portion can be retained in the recessed region by mechanical force between an outer surface of the second leadframe portion and an inner surface of the sidewall, where the outer surface of the second leadframe portion can be in contact with the inner surface of the sidewall.

BRIEF DESCRIPTION OF THE DRAWINGS

In the drawings, which are not necessarily drawn to scale, like reference symbols may indicate like and/or similar components (elements, structures, etc.) in different views. The drawings illustrate generally, by way of example, but not by way of limitation, various implementations discussed in the present document. Reference symbols show in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of that element are illustrated.

DETAILED DESCRIPTION

This disclosure relates to semiconductor device package assemblies (package assemblies, packages, assemblies, etc.) and associated methods of manufacture. More specifically, this description relates to leadframes having efficient heat dissipation characteristics that can be included in semiconductor device package assemblies. The approaches described herein can overcome, at least some of, the drawbacks of previous approaches noted above. For instance, in some implementations, multiple leadframe portions, which can be formed from materials (e.g., metal sheets, cooper sheets, etc.) with respective uniform thickness(es), can be used to produce a leadframe with efficient heat dissipation characteristics.

For instance, a first leadframe portion that is formed from a first metal sheet having a uniform thickness can be used in combination with a second leadframe portion formed from a second metal sheet also having a uniform thickness to form a leadframe with an increased thickness (e.g., which can define an area where a power semiconductor device will be attached) to provide efficient thermal dissipation. In some implementations, the first metal sheet and the second metal sheet can have a same thickness, the first metal sheet and the second metal sheet can be defined from a single metal sheet, the first metal sheet and the second metal sheet can be formed of a same material (which may be desirable for thermal expansion), the first metal sheet and the second metal sheeted can have different thicknesses,), the first metal sheet and the second metal sheeted can have formed of different materials, etc. The particular arrangement will depend on the specific implementation.

The approaches described herein, as compared to current approaches, can reduce loss cost, as thinner (e.g., less expensive) raw materials (e.g., metal sheets) can be used to produce the individual leadframe portions. Also, such approaches can reduce costs for producing leadframes with heat spreaders (or for producing heat sinks), as metal sheets (e.g., for use as leadframe raw materials) having areas with different thicknesses for, respectively, heat spreaders (or heat sinks), and signal leads/terminals, are not used. As such metal sheets (having different areas with different thicknesses) can be expensive to produce (to the cost of metal processing), the approaches described herein can reduce overall cost as compared to such approaches. For example, the approaches described herein can include the use of metal sheets (e.g., leadframe raw materials) with respective uniform thicknesses, which can reduce overall materials cost (e.g., loss costs and/or manufacturing costs), as opposed to previous approaches.

The approaches described herein, and shown in the drawings, are for purposes of illustration and given by way of example. In some implementations, other elements and/or manufacturing operations can be included and/or performed. For instance, in some implementations, the assemblies shown and described herein can be produced using strips or arrays of leadframe portions, which can be singulated from one another using a saw or a laser to cut the assemblies apart, or can be singulated using a mechanical punch (e.g., tool and die) process. Further, the assemblies shown and described herein can be encapsulated (at least partially) using a molding compound, such as an epoxy molding compound, using injection molding, transfer molding, etc. In some implementations, one or more elements and/or process operations described herein can be eliminated.

Figure 1A:
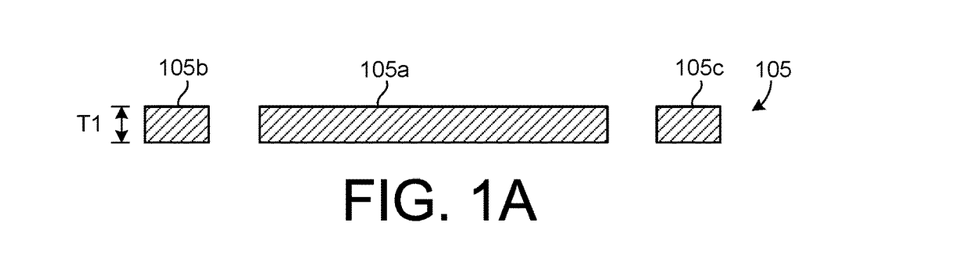
FIGS. 1A-1G are schematic, side-view diagrams illustrating operations of a manufacturing process for producing a semiconductor device package assembly including a leadframe with efficient heat dissipation characteristics.
Figure 1B:
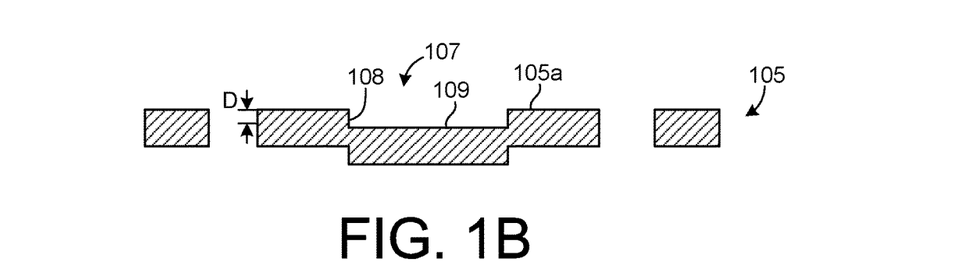

FIGS. 1A-1F are schematic, side-view diagrams illustrating operations of a manufacturing process for producing a semiconductor device package assembly including a leadframe (e.g., having multiple leadframe portions) with efficient heat dissipation characteristics. As shown in FIG. 1B, a first leadframe portion 105 can be provided, where the leadframe portion 105 can be formed from a metal sheet (e.g., a copper metal sheet, or other appropriate leadframe material) having a uniform thickness T1, which in some implementations can be in a range of 0.3 millimeters (mm) to 1.0 mm. The leadframe portion 105 can include a central portion 105*a*, a signal terminal 150*b* and a signal terminal 105*c*.

While elements of the leadframe portion 105 in the side-views of FIGS. 1A-1G are shown as being separate, in some implementations, the central portion 105*a* and the signal terminals 105*b* and 105*c* can (e.g., during manufacturing of a corresponding assembly) be coupled with (attached to, etc.) a support frame (not shown). Such a support frame can, in some implementations, be removed as part of a singulation process.

The central portion 105*a* of the leadframe portion 105 can also be referred to as a die attach portion, a die pad portion, a heat dissipation portion, etc. For instance, the central portion 105*a*, in combination with one or more leadframe portions (such as described herein) can be configured to dissipate heat generated by a device (e.g., a power semiconductor device) that is coupled with the central portion 105*a*, or is coupled with another leadframe portion that is coupled with the central portion 105*a*, where the other leadframe portion can be disposed between the central portion 105*a* and the device for which generated heat is being dissipated.

As shown in FIG. 1B, a recessed region 107 can be formed in (defined in, etc.) the central portion 105*a*. The recessed region 107 can include a sidewall 108 and a bottom 109 (a floor, etc.). In some implementations, the sidewall 108 can be orthogonal to (perpendicular to, etc.) a plane defined by a surface (e.g., an inner surface) of the bottom 109 of the recessed region 107. In some implementations, the recessed region 107 can be formed using a metal stamping process, such as using a support block or jig (e.g., to hold the central portion 105*a* during formation of the recessed region 107), a die and a stamping tool, which can be properly aligned by the die. The central portion 105*a*, after forming the recessed region 107 as shown in FIG. 1B and described above, can be referred to as being half-blanked, where a depth D of the recessed region 107 can be approximately half of the thickness of the central portion 105*a* (e.g., half of the thickness T1).

Figure 1C:
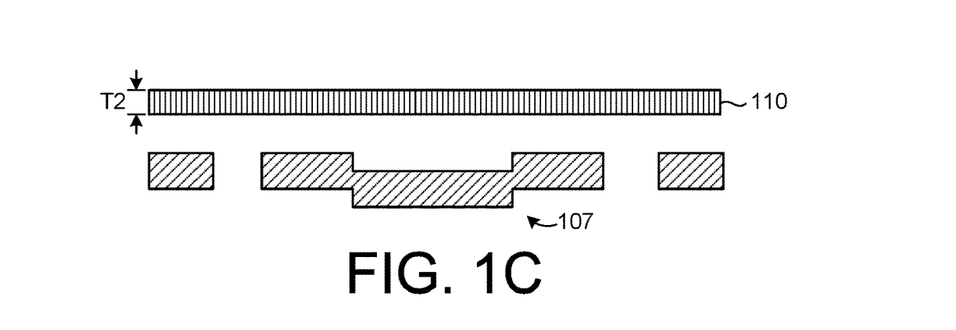

In FIG. 1C, a sheet of leadframe material 110 having a thickness T2 can be provided. In some implementations, the thickness T2 can in a same range as the thickness T1, and/or can be equal to the thickness T1. In some implementations, the thickness T2 can be different than the thickness T1. The thicknesses T1 and T2 (and relationships of those thicknesses to each other and to the depth D) discussed with respect to FIGS. 1A-1G, can also similarly apply to the other example implementations described herein. The leadframe material 110 can be a same material as the leadframe portion 105 and, in some implementations, can be formed from a same sheet of leadframe material as the leadframe portion 105. Using the same material, or metal composition (whether from a single leadframe material sheet or different leadframe material sheets) for the leadframe portion 105 and the leadframe material 110 can be beneficial, as it may prevent mismatch between thermal coefficients of expansion of the different leadframe portions 105*a* and 110*a* that are used for thermal dissipation.

Figure 1D:
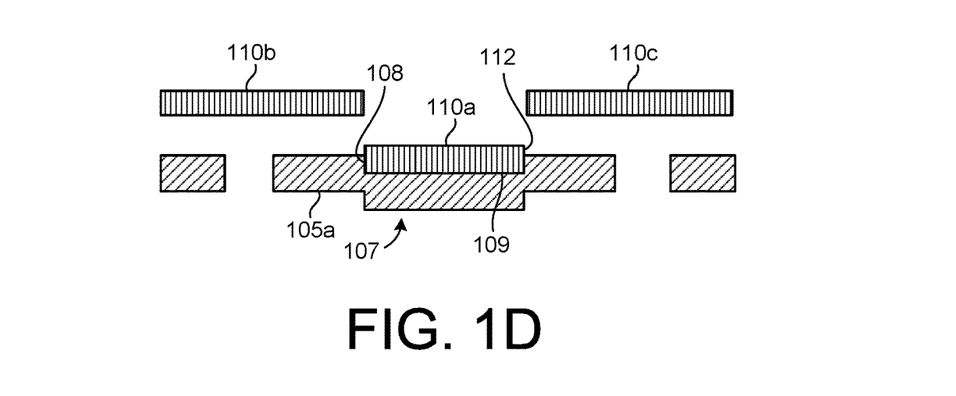

As illustrated in FIG. 1D, a second leadframe portion 110*a* can be formed from the leadframe material 110, leaving portions 110*b* and 110*c* as residue (which can be scrap, or can be used for other purposes, such as forming additional leadframe portions). In some implementations, while not specifically shown in FIG. 1D, the leadframe portion 110*a* can be formed from the leadframe material 110 using a stamping tool and die (to align the stamping tool), such as using the process illustrated in FIGS. 3G-3I. The tool can also be used to press-fit the leadframe portion 110a into the recessed region 107 after the leadframe portion 110a is formed (e.g., punched, cut, etc.) from the leadframe material 110.

As shown in FIG. 1D (and noted above), the leadframe portion 110a can be press-fit into the recessed region 107, such that a bottom surface of the leadframe portion 110a is in contact (e.g., direct contact, physical contact, etc.) with the bottom 109 of the recessed region 107. In some implementations, the leadframe portion 110a can be retained in the recessed region 107 by mechanical forces that are present (e.g., as a result of press-fitting) between an outer surface (e.g., an outer edge, an outer perimeter edge, etc.) 112 of the leadframe portion 110a and an inner surface of the sidewall 108, the outer surface 112 of the leadframe portion 110a being in contact (e.g., physical contact, direct contact, etc.) with the inner surface of the sidewall 108.

As also shown in FIG. 1D, the leadframe portion 110a can extend above the recessed region 107 (e.g., above an upper surface of the central portion 105a). In another words, a first part of the leadframe portion 110a can be disposed within (inside, etc.) the recessed region 107, while a second part of the leadframe portion 110a can be disposed outside (e.g., above, etc.) the recessed region 107.

Figure 1E:
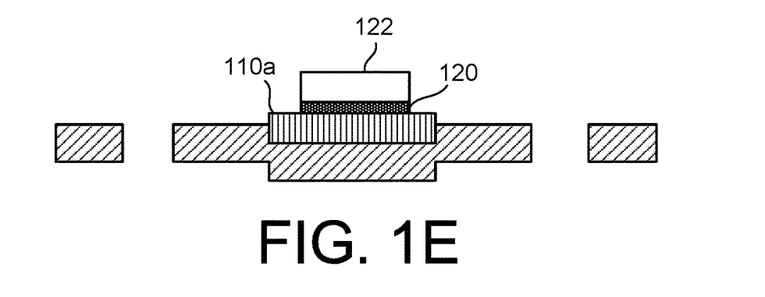
Figure 1F:
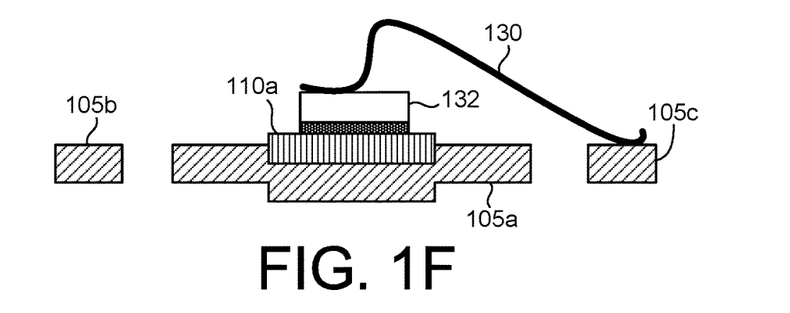
Figure 1G:
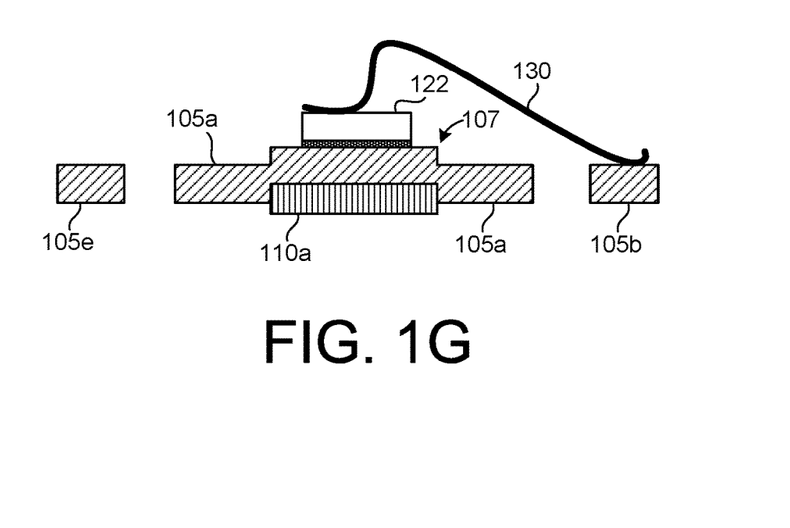

Referring to FIG. 1E, a die attach material 120 (e.g., an electrically and/or thermally conductive material) can be used to couple a semiconductor die 122 with the leadframe portion 110a. As shown in FIG. 1F, electrical connections can be made between the semiconductor die 122, the signal terminal 105c and/or the signal terminal 105b (connection not specifically shown in FIG. 1F). Referring to FIG. 1G, as compared to FIGS. 1E and 1F, the combination of leadframe portion 105 and the leadframe portion 110a are inverted, and the die attach material 120 is used to couple the semiconductor die 122 with the central portion 105a of the leadframe portion 105, e.g., a bottom side of the recessed region 107). As shown in FIG. 1G, wire bonds 130 can be used to electrically couple the semiconductor die 122 with the signal terminal 105b and/or the signal terminal 105c (connection not shown in FIG. 3G).

Figure 2A:
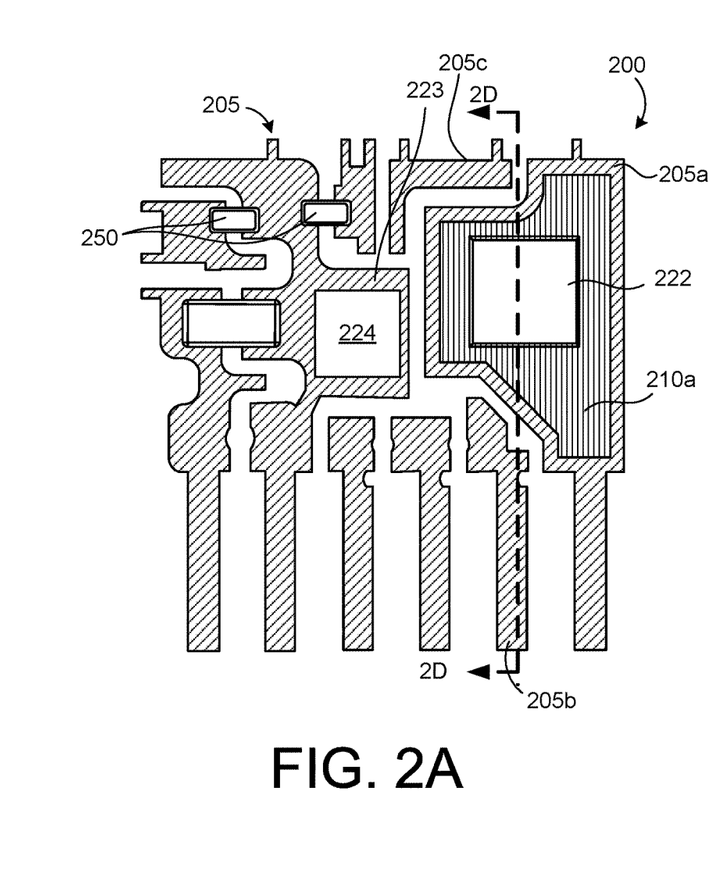
FIG. 2A is a plan view diagram of a front side of a semiconductor device package assembly including a leadframe with efficient heat dissipation characteristics.

FIG. 2A is a plan view diagram of a front side of a semiconductor device package assembly 200 including a leadframe with efficient heat dissipation characteristics. As shown in FIG. 2A, the assembly 200 includes a first leadframe portion 205, a second leadframe portion 210a, a semiconductor die 222, a die pad 223, a semiconductor die 224 coupled to the die pad 223, and passive components 250 (e.g., inductors, resistors and/or capacitors) coupled with the first leadframe portion 205. In some implementations, the assembly 200 can be used implement a an igniter device for an ignition coil of an internal combustion engine. For instance, the semiconductor die 222 can include an insulated-gate bipolar transistor (IGBT), while the semiconductor die 224 can implement a control circuit of the igniter. In some implementations, other devices can be implemented using the assembly 200, such as a power converter, as one example.

Figure 2B:
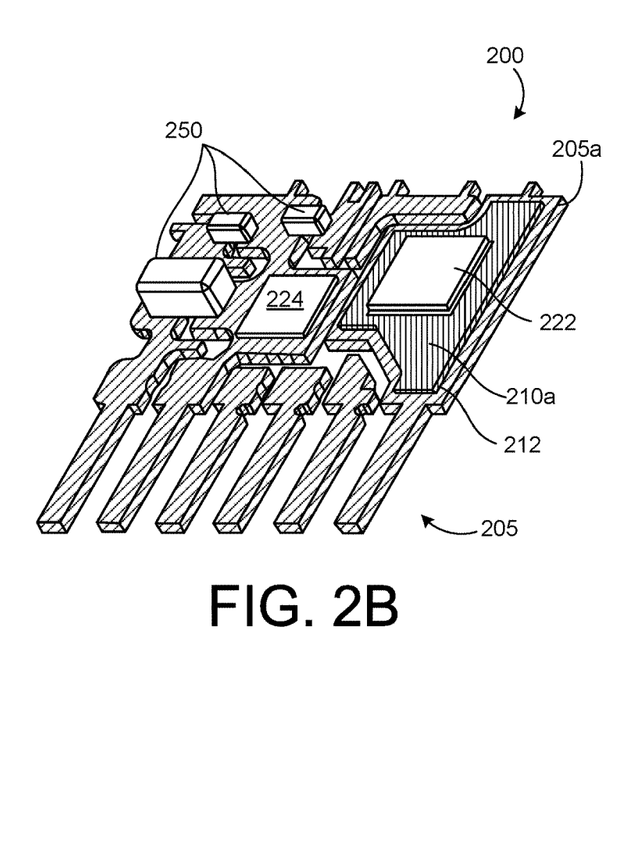
FIG. 2B is a front-side isometric view of the semiconductor device package assembly of FIG. 2A.
Figure 2C:
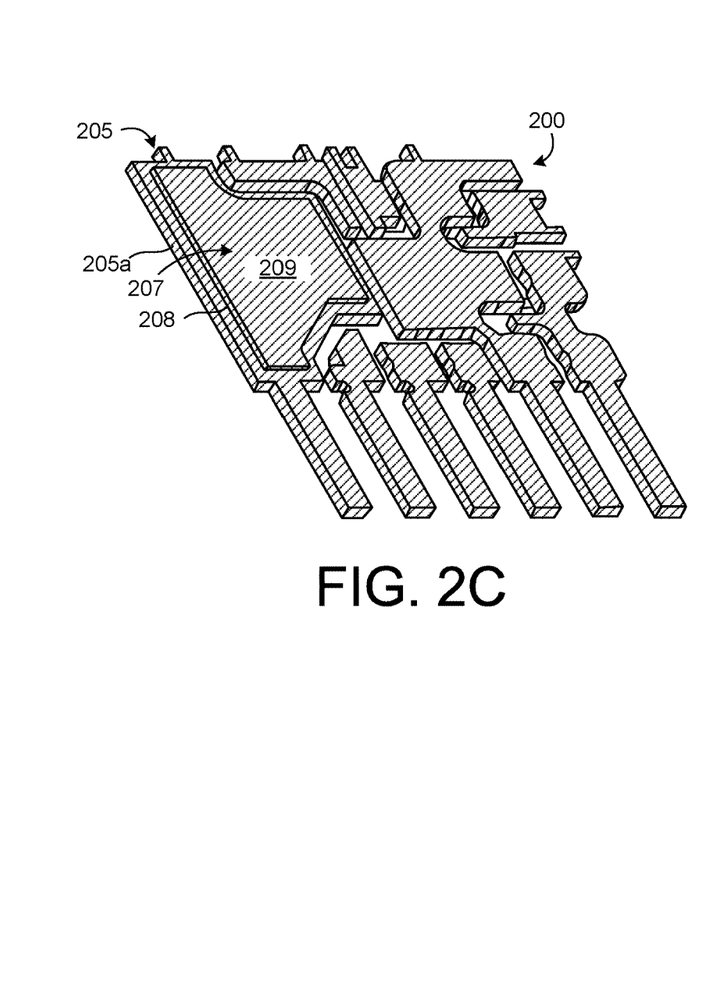
FIG. 2C is a back-side isometric view of the semiconductor device package assembly of FIG. 2A.
Figure 2D:
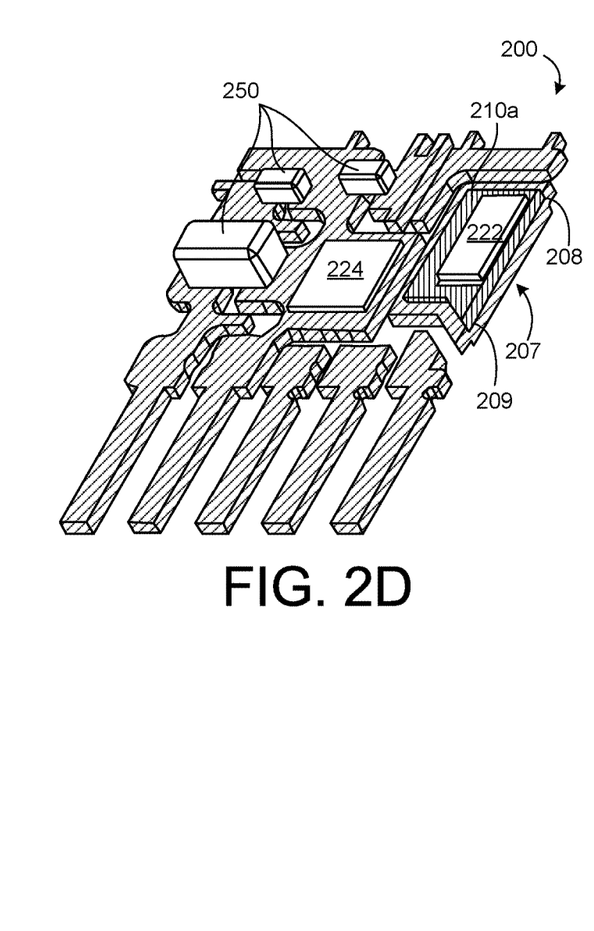
FIG. 2D is a front-side isometric, sectional view of the semiconductor device package assembly of FIG. 2A.

A section line 2D-2D is also shown in FIG. 2A, which corresponds with the front-side isometric sectional view shown in FIG. 2D (as well as with the sectional views of FIGS. 3A-3K). As shown in FIG. 2A, the leadframe portion 205 includes a die pad portion 205a (corresponding with the central portion 105a of FIGS. 1A-1G), as well as a number of signal terminals, including signal terminals 205b and 205c.

FIG. 2B is a front-side isometric view of the semiconductor device package assembly 200 of FIG. 2A. As can be seen in FIG. 2B, the leadframe portion 210a extends above the die pad portion 205a (e.g., extends out of a recessed region formed in the die pad portion 205a). FIG. 2C is a back-side isometric view of the semiconductor device package assembly 200 of FIG. 2A. In FIG. 2C, a backside of the leadframe portion 205, including a recessed region 207 (in which the leadframe portion 210a is press-fit) that is defined in the die pad portion 205a, is illustrated. FIG. 2C further illustrates an outside surface of a sidewall 208 of the recessed region 207 and a bottom side (back side, outside, etc.) surface of a bottom 209 of the recessed region 207.

FIG. 2D is a front-side isometric view of the semiconductor device package assembly of FIG. 2A sectioned along the section line 2D-2D in FIG. 2A, which also corresponds with the section lines of the cross-sectional views of FIGS. 3A-3K. As can be seen in FIG. 2D, similar to, e.g., FIG. 1D, in the assembly 200, the leadframe portion 210a can be press-fit into the recessed region 207, such that a bottom surface of the leadframe portion 210a is in contact (e.g., direct contact, physical contact, and so forth) with the bottom 209 (e.g., an inner surface of the bottom 209) of the recessed region 207. Accordingly, the leadframe portion 210a can be retained in the recessed region 207 by mechanical force that is present (e.g., as a result of press-fitting) between an outer surface (e.g., an outer edge, an outer perimeter edge, etc.) 212 of the leadframe portion 210a and an inner surface of the sidewall 208, at least a portion of the outer (perimeter) surface 212 of the leadframe portion 210a being in contact (e.g., physical contact, direct contact, etc.) with the inner surface of the sidewall 108.

Figure 3A:
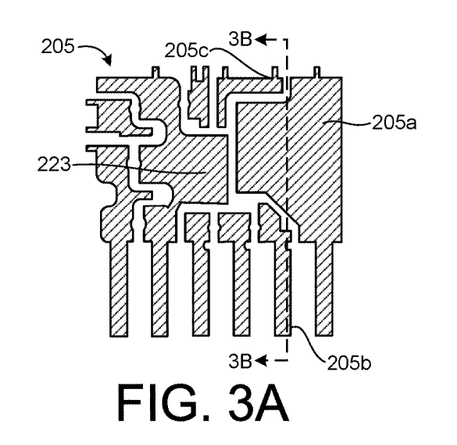
FIGS. 3A-3K are diagrams illustrating operations of a manufacturing process for producing the semiconductor device package assembly of FIGS. 2A-2D.
Figure 3B:
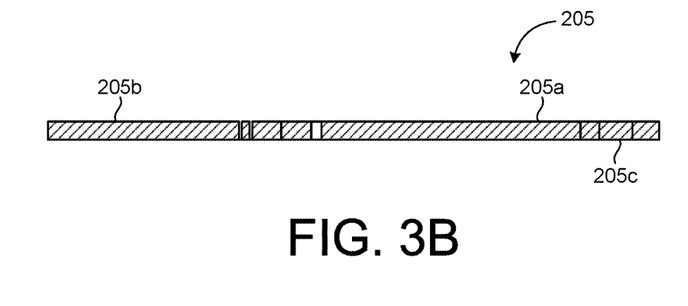

FIGS. 3A-3K are diagrams illustrating operations of a manufacturing process for producing the semiconductor device package assembly 200 of FIGS. 2A-2D. Referring to FIG. 3A, the first leadframe portion 205 is shown in plan view. As illustrated in FIG. 3A, as discussed above with respect to FIGS. 2A-2D, the leadframe portion 205 includes the die pad portion 205a, and signal terminals 205b and 205c. The section line 3B-3B in FIG. 3A corresponds with the side, cross-sectional view of FIG. 3B. That is, FIG. 3B illustrates a side, cross-sectional view of the leadframe portion 205 along the section line 3B-3B in FIG. 3A.

Figure 3C:
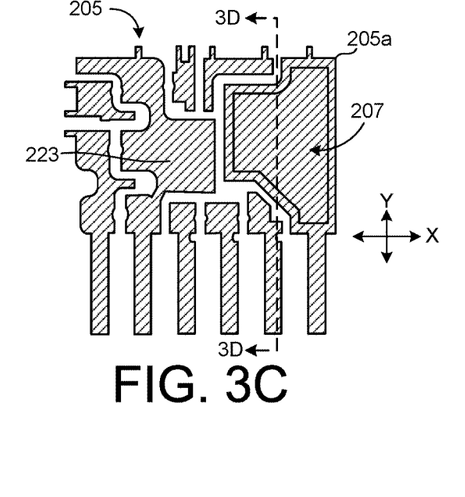
Figure 3D:
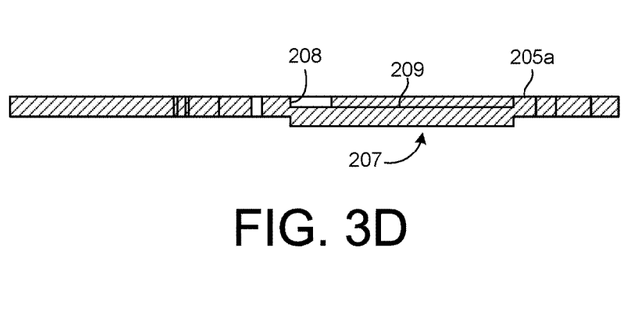

As shown in the plan view of FIG. 3C, the recessed region 207 can be formed in (defined in, etc.) the die pad portion 205a, where the section line 3D-3D in FIG. 3C corresponds with the side, cross-sectional view of FIG. 3D. As shown in FIG. 3D, the recessed region 207 includes a sidewall 208 and a bottom 209. In some implementations, the sidewall 208 can be orthogonal to (perpendicular to, etc.) a plane defined by a surface of the bottom 209 (e.g., a plane as defined by the x-axis and the y-axis in FIG. 3C) of the recessed region 207. As discussed above with respect to the recessed region 107, in some implementations, the recessed region 207 can be formed using a metal stamping process, such as using a support block (e.g., to hold the die pad portion 205a), a die and a stamping tool, where the stamping tool can be properly aligned by the die. The die pad portion 205a, after forming the recessed region 207 as shown in FIGS. 3C and 3D, as with the central portion 105a of the leadframe portion 105 described above, can be referred to as being half-blanked, where a depth of the recessed region 207 can approximately half the thickness of the die pad portion 205a.

Figure 3E:
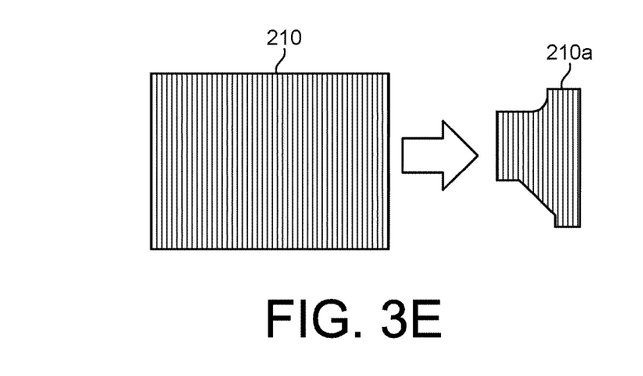
Figure 3F:
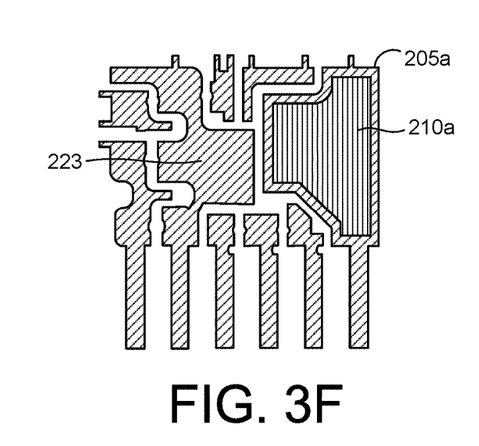
Figure 3G:
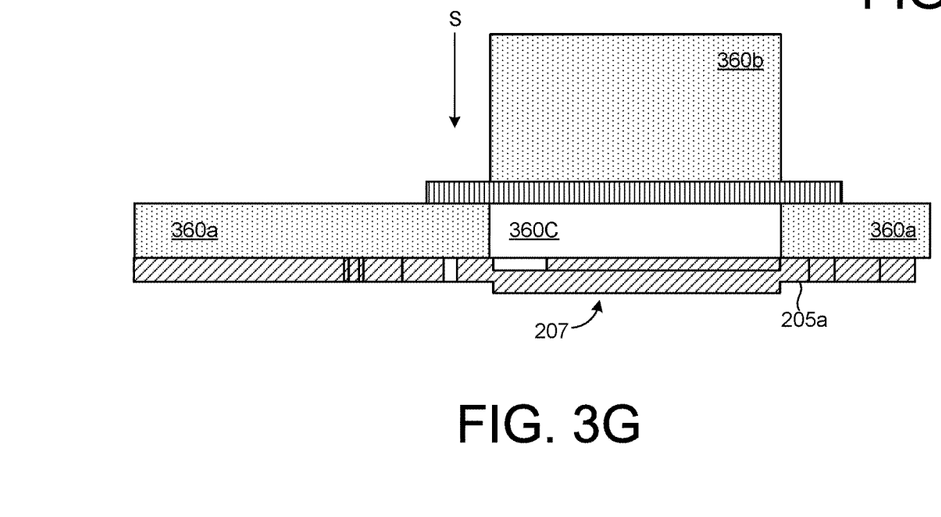
Figure 3H:
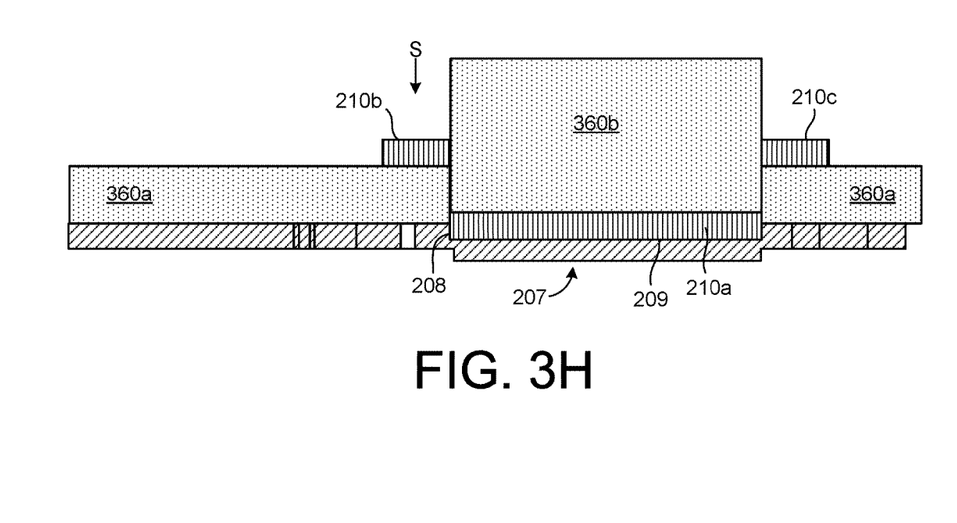
Figure 3I:
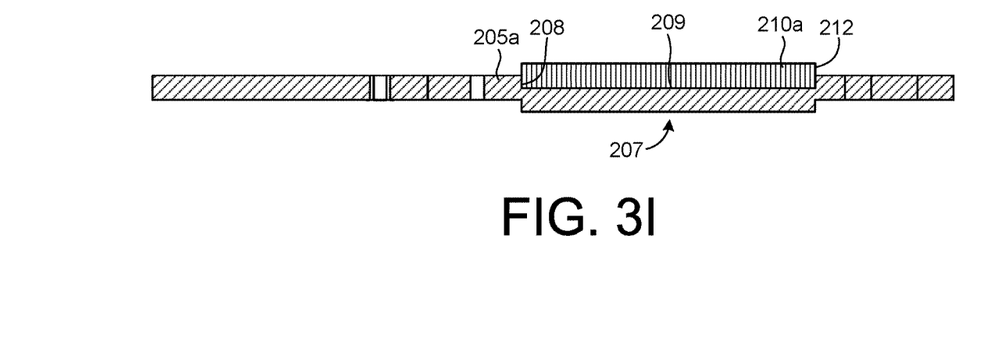

In FIG. 3E, a sheet of leadframe material 210 can be provided. In some implementations, a thickness of the material 210 can be equal to a thickness of the leadframe portion 205. In some implementations, the thickness of the material 210 can be different than the thickness of the leadframe portion 205. The leadframe material 210 can be a same material as the leadframe portion 205 and, in some implementations, can be from a same sheet of leadframe material as the leadframe portion 205. Using the same material for the leadframe portion 205 and the leadframe material 210 can be beneficial, as it may prevent mismatch between thermal coefficients of expansion of the different leadframe portions. As illustrated in FIG. 3E, the second leadframe portion 210a can be formed from the leadframe material 210 and, as shown in the plan view of FIG. 3F, the leadframe portion 210a can be press-fit into the recessed region 207 of the die pad portion 205a, for which an example process is illustrated in FIGS. 3G-3I. That is, FIGS. 3G-3I are side, cross-sectional views along the same section line as section lines 2D-2D, 3A-3A, 3D-3D and 3K-3K (in FIG. 3J) illustrating the formation, and press-fitting of the leadframe portion 210a.

As shown in FIGS. 3G-3I, a die 360a and a tool (e.g., a punch or press-fit tool) 360b can be used to form the leadframe portion 210a from the leadframe material 210. For instance, as shown in FIG. 3G, the leadframe material 210 can be placed between the die 360a and the tool 360b, such that an aperture 360c of the die 360a is positioned above the recessed region 207 and below the tool 360b (e.g., along the direction S), where the tool 360b and the aperture 360c can each have a shape corresponding to a shape (e.g., a perimeter) of the recessed region 207.

As shown in FIG. 3H (as compared to FIG. 3G), mechanical pressure can be applied to the tool 360b (e.g., as part of a metal stamping process), causing the tool 360b to form (stamp, punch, etc.) the leadframe portion 210a from the leadframe material 210, leaving portions 210b and 210c as residue (which can be scrap, or can be used for other purposes, such as forming additional leadframe portions). While shown separately, portions 210b and 210c can be a contiguous piece and, in this example, appear separate in FIG. 3H due to the arrangement of the various elements in the cross-sectional view shown. As shown in FIG. 3H, the tool 360b can also be used to press-fit the leadframe portion 210a into the recessed region 207 after the leadframe portion 210a is formed (e.g., punched, cut, etc.) from the leadframe material 210, where the aperture 360c of the die 360b can align the leadframe portion 210a with the recessed region 207.

As shown in FIG. 3I (and noted above), the leadframe portion 210a can be press-fit into the recessed region 207, such that a bottom surface of the leadframe portion 210a is in contact (e.g., direct contact, physical contact, and so forth) with the bottom 209 of the recessed region 207. In some implementations, the leadframe portion 210a can be retained in the recessed region 207 by mechanical force that is present (e.g., as a result of press-fitting) between an outer surface (e.g., an outer edge, an outer perimeter edge, etc.) 212 of the leadframe portion 210a and an inner surface of the sidewall 208, at least a portion of the outer surface 212 of the leadframe portion 210a being in contact (e.g., physical contact, direct contact, etc.) with the inner surface of the sidewall 208.

As also shown in FIG. 3I, the leadframe portion 210a can extend above the recessed region 207 (e.g., above an upper surface of the die pad portion 205a). In another words, a first part of the leadframe portion 210a can be disposed within (inside, etc.) the recessed region 207, while a second part of the leadframe portion 210a can be disposed outside (e.g., above, etc.) the recessed region 207.

Figure 3J:
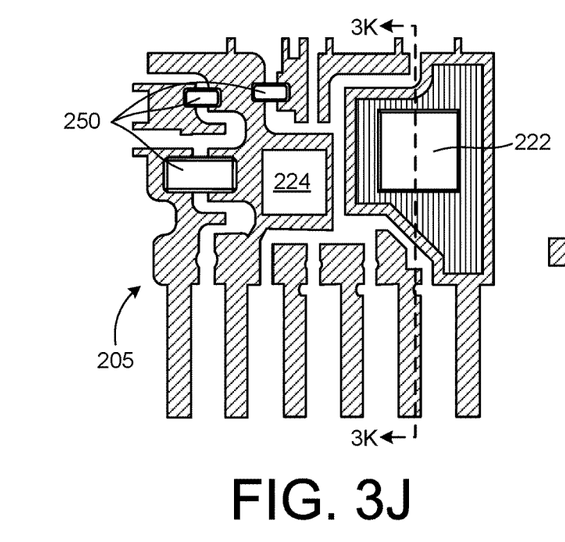
Figure 3K:
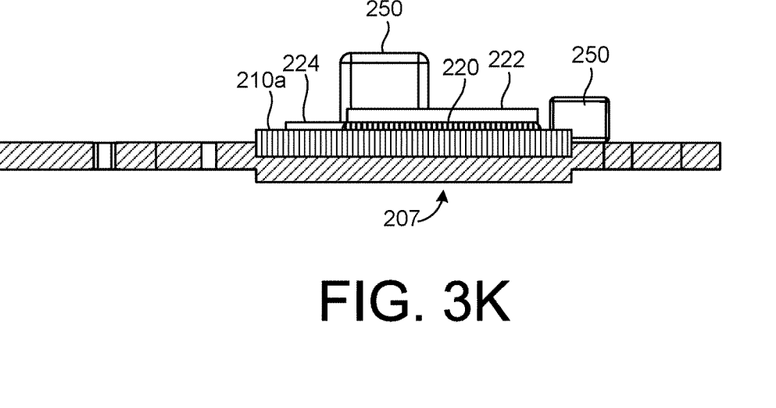

Referring to the plan view of FIG. 3J, after press-fitting the leadframe portion 210a into the recessed region 207, semiconductor die 222 and 224, as well as discrete (e.g., passive) devices 250 can be coupled with the leadframe portion 205 or the leadframe portion 210a. As shown in FIG. 3K, which is a side, cross-sectional view along section line 3K-3K in FIG. 3J, a die attach material 220 can be used to couple (affix, attach, etc.) the semiconductor die 222 to the leadframe portion 210a. Similarly, though not visible in FIG. 3K, the die attach material 220 can also be used to couple (affix, attach, etc.) the semiconductor die 224 to the die pad 223. As discussed above with respect to FIG. 1E, the die attach material 220 can be an electrically and/or thermally conductive material. Though not specifically shown in FIG. 3K, wire bond attachments can be used to couple the semiconductor die 222 and 224 with signal terminals (e.g., 205b and/or 205c) of the leadframe portion 205.

Figure 4A:
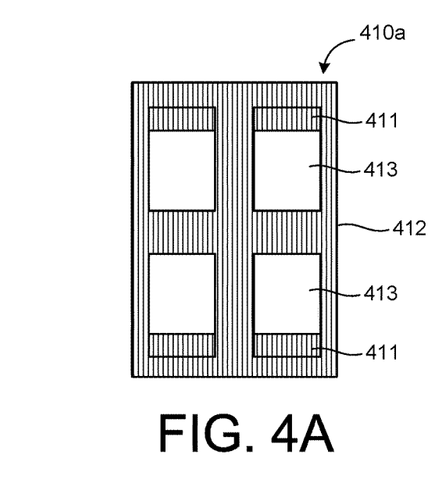
FIG. 4A is a diagram illustrating a top-down view of a leadframe portion that can be included in a leadframe with efficient heat dissipation characteristics.

FIG. 4A is a diagram illustrating a top-down view of a leadframe portion 410a that can be included in a leadframe with efficient heat dissipation characteristics. As shown in FIG. 4A, the leadframe portion 410 can include a plurality of heat radiating fins 411, which can be formed, e.g., using a metal stamping process, from a sheet of leadframe material. For instance, as illustrated in FIG. 4A, the leadframe portion 410a can include a plurality of apertures 413, where each aperture 413 can be defined when a respective fin 411 is formed using, e.g., metal stamping. In other words, when each of the fins 411 is formed (e.g. by stamping and bending a leadframe material sheet), a corresponding aperture 413 can be formed.

Figure 4B:
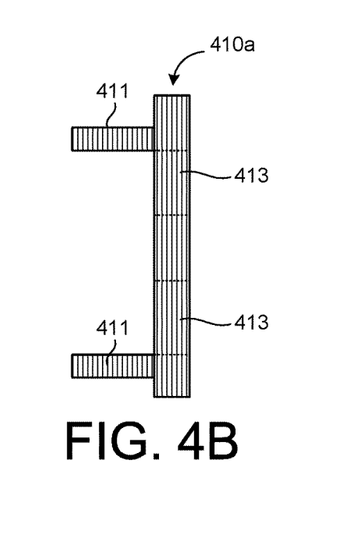
FIG. 4B is a diagram illustrating a first side view of the leadframe portion of FIG. 4A.
Figure 4C:
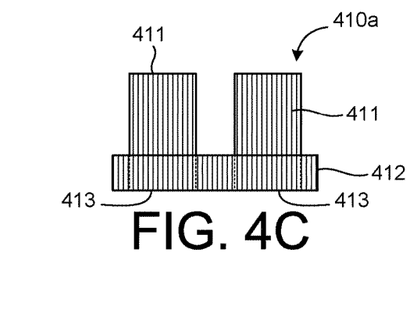
FIG. 4C is a diagram illustrating a second side view of the leadframe portion of FIG. 4A.

FIG. 4B shows a right side view of the leadframe portion 410a of FIG. 4A, illustrating the fins 411 and corresponding apertures 413 (the internal edges of which are illustrated by dashed lines). FIG. 4C shows a front side view of the leadframe portion 410a of FIG. 4A, illustrating the fins 411 and corresponding apertures 413 (the internal edges of which are illustrated by dashed lines).

Figure 5A:
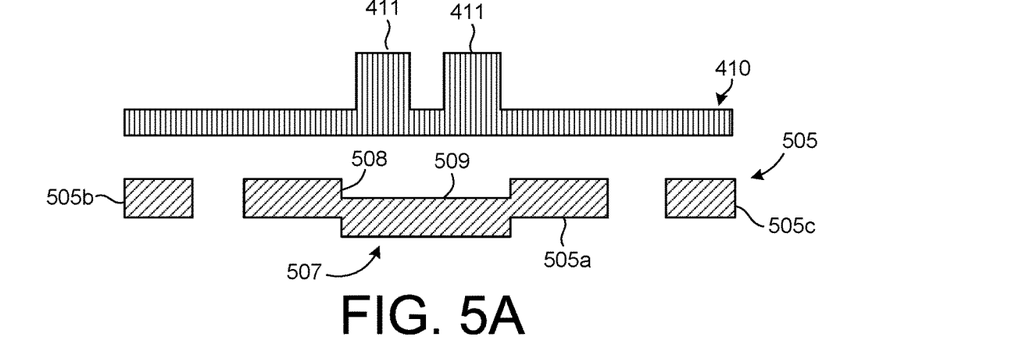
FIGS. 5A-5C are schematic, side-view diagrams illustrating operations of a manufacturing process for producing another semiconductor device package assembly including a leadframe with efficient heat dissipation characteristics.
Figure 5B:
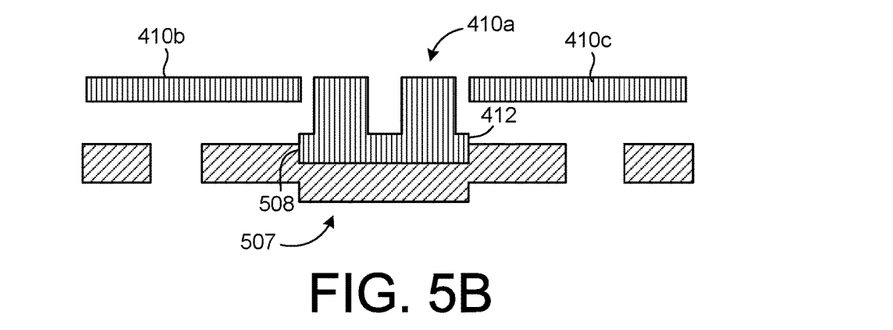
Figure 5C:
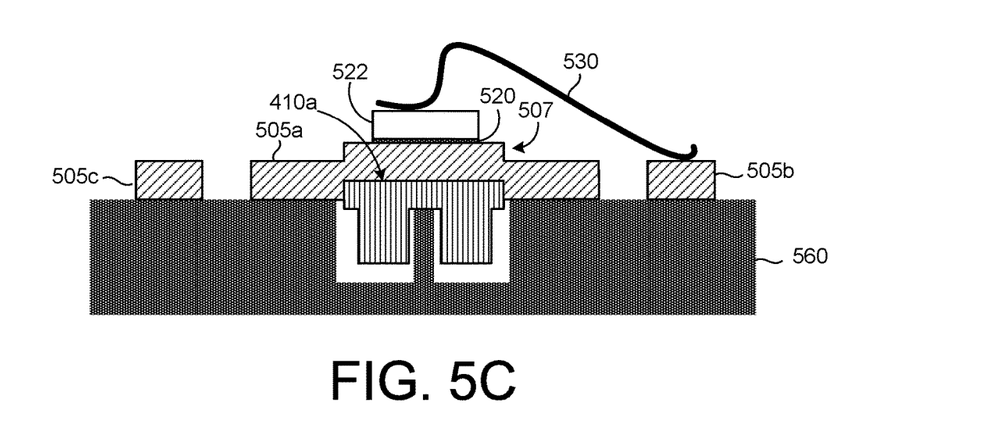

FIGS. 5A-5C are schematic diagrams illustrating operations of a manufacturing process for producing another semiconductor device package assembly including a leadframe with efficient heat dissipation characteristics that includes the leadframe portion 410a of FIGS. 4A-4C. Referring to FIG. 5A, a sheet of leadframe material 410 and a leadframe portion 505 are shown. As illustrated in FIG. 5A, the leadframe material 410 has heat radiating fins 411, such as those shown in FIGS. 4A-4C, formed therefrom. The apertures 413 shown in FIGS. 4A-4C are not specifically shown in FIGS. 5A-5C. Also shown in FIG. 5A, the leadframe portion 505, similar to the leadframe portion 105 in, e.g., FIGS. 1A-1G, includes a half-blanked central portion 505a, a signal terminal 505b and a signal terminal 505c. The half-blanked central portion 505a, as shown in FIG. 5A, includes a recessed region 507 that defines a sidewall 508 and a bottom 509, where the sidewall 508 can be orthogonal to a plane defined by a surface of the bottom 509.

As illustrated in FIG. 5B, the leadframe portion 410a can be formed from the leadframe material 410 (with the fins 411 already formed in the leadframe material 410), leaving portions 410b and 410c as residue (which can be scrap, or can be used for other purposes, such as forming additional leadframe portions). In some implementations, while not specifically shown in FIG. 5B, the leadframe portion 410a can be formed from the leadframe material 410 using a stamping tool and die (to align the stamping tool), such as using a similar process as illustrated in FIGS. 3G-3I. The tool that is used to form the leadframe portion 410a from the leadframe material 410 can be configured fit over the fins 411, so as to prevent damage to the fins 411 during metal stamping. The tool used to form the leadframe portion 410a from the leadframe material 410 can also be configured to press-fit the leadframe portion 410a into the recessed region 507 after the leadframe portion 410a is formed (e.g., punched, cut, etc.) from the leadframe material 410.

As shown in FIG. 5B, the leadframe portion 410a can be press-fit into the recessed region 507, such that a bottom surface of the leadframe portion 410a is in contact (e.g., direct contact, physical contact, etc.) with the bottom 509 of the recessed region 507. In some implementations, the leadframe portion 410a can be retained in the recessed region 507 by mechanical forces that are present (e.g., as a result of press-fitting) between an outer surface (e.g., an outer edge, an outer perimeter edge, etc.) 412 of the leadframe portion 410a and an inner surface of the sidewall 508, the outer surface 412 of the leadframe portion 410a being in contact (e.g., physical contact, direct contact, etc.) with the inner surface of the sidewall 508.

As also shown in FIG. 5B, the leadframe portion 410a can extend above the recessed region 507 (e.g., above an upper surface of the central portion 505a). In another words, a first part of the surface 412 of the leadframe portion 410a can be disposed within (inside, etc.) the recessed region 507, while a second part of the surface 412 (as well as the fins 411) of the leadframe portion 410a can be disposed outside (e.g., above, etc.) the recessed region 507 (e.g., above an upper surface of the central portion 505a.

Referring to FIG. 5C, the leadframe of FIG. 5B (including the leadframe portion 410a and the leadframe portion 505) can be inverted (from the view of FIG. 5B) and placed in a support block (jig) 560. The support block 560 can be configured to protect the fins 411 and support the leadframe during additional processing operations. For example, as shown in FIG. 5, with the leadframe in the support block 560, a die attach material 520 (e.g., an electrically and/or thermally conductive material) can be used to couple a semiconductor die 522 with a bottom side of the recessed region 507. As also shown in FIG. 5C, electrical connections, such as a wire bond 530, can be made between the semiconductor die 522, the signal terminal 505b and/or the signal terminal 505c (connection not specifically shown in FIG. 5C).

Figure 6A:
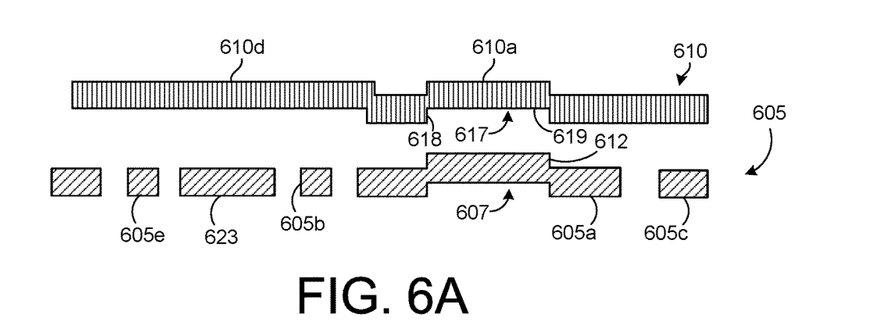
FIGS. 6A-6C are schematic, side-view diagrams illustrating operations of a manufacturing process for producing yet another semiconductor device package assembly including a leadframe with efficient heat dissipation characteristics.
Figure 6B:
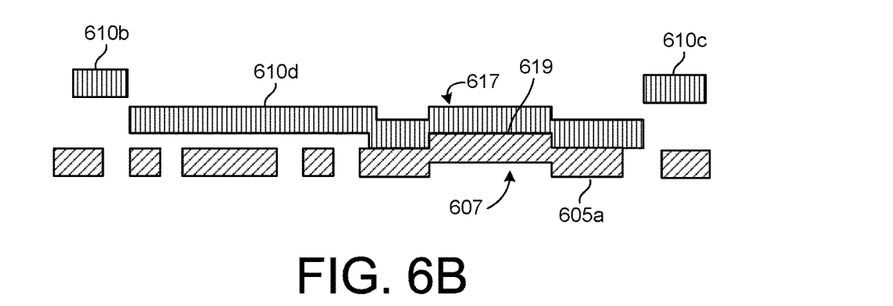
Figure 6C:
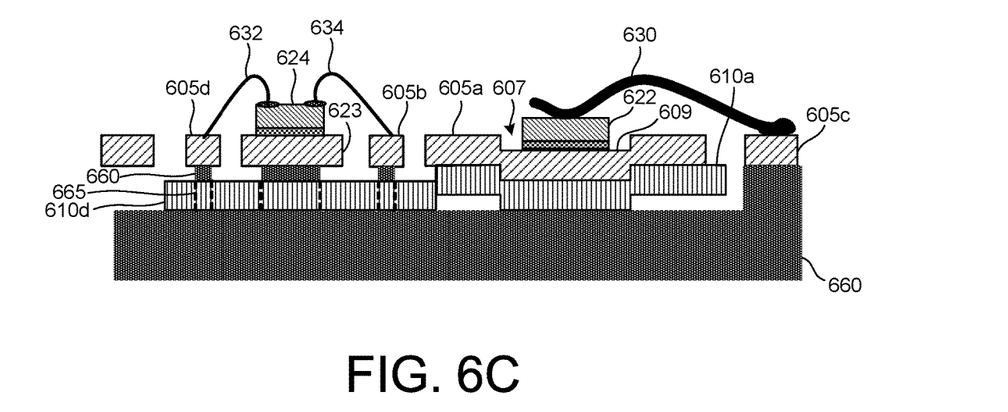

FIGS. 6A-6C are schematic diagrams illustrating operations of a manufacturing process for producing yet another semiconductor device package assembly including a leadframe with efficient heat dissipation characteristics. Referring to FIG. 6A, a sheet of leadframe material 610 and a leadframe portion 605 are shown. As illustrated in FIG. 6A, the leadframe material 610 can include a half-blanked portion 610a and a heat spreader portion 610d that is continuous with the half-blanked portion 610a. The half-blanked portion 610a can include a recessed region 617, which can be similar to other recessed regions described herein. Also shown in FIG. 6A, the leadframe portion 605, similar to the leadframe portions 105 and 505, includes a half-blanked portion 605a, a signal terminal 605b and a signal terminal 605c. In the example of FIG. 6A, the leadframe portion 605 also includes a die pad 623 and a signal terminal 605d. The half-blanked portion 605a, and shown in FIG. 6A, includes a recessed region 607, which can be similar to the other recessed regions described herein.

As illustrated in FIG. 6B, the contiguous half-blanked portion 610a and heat spreader portion 610d can be formed from the leadframe material 610, leaving portions 610b and 610c as residue (which can be scrap, or can be used for other purposes, such as forming additional leadframe portions). In some implementations, while not specifically shown in FIG. 6B, the contiguous half-blanked portion 610a and heat spreader portion 610d can be formed from the leadframe material 610 using a stamping tool and die (to align the stamping tool), such as using a similar process as illustrated in FIGS. 3G-3I. The tool used to form the contiguous half-blanked portion 610a and heat spreader portion 610d from the leadframe material 610 can also be configured to press-fit the recessed region 617 of the half-blanked portion 610a onto the recessed region 607 of the half-blanked portion 605a (e.g., onto a top surface, or top side of the recessed region 607 as shown in FIG. 6B).

As shown in FIG. 6B, the recessed region 617 of the half-blanked portion 610a can be press-fit onto the top side of the recessed region 607 (as shown in FIG. 6B), such that an upper (top, etc.) surface of the recessed region 607 is in contact (e.g., direct contact, physical contact, etc.) with a bottom 619 (shown in FIG. 6A) of the recessed region 617 (or could be referred to as a top, or a ceiling of the recessed region 617 in the view of FIG. 6B). In some implementations, the half-blanked portion 605a can be retained in the recessed region 617 by mechanical forces that are present (e.g., as a result of press-fitting) between an outer surface (e.g., an outer edge, an outer perimeter edge, etc.) 612 of the leadframe portion 605a and an inner surface of a sidewall 618 (shown in FIG. 6A), the outer surface 612 of the recessed region 607 being in contact (e.g., physical contact, direct contact, etc.) with the inner surface of the sidewall 618.

As also shown in FIG. 6B, the half-blanked portion 610a can be disposed on (extend along, etc.) an upper surface of the half-blanked portion 605a. In another words, the half-blanked portion 610a can, at least partially, cover an upper surface (as shown in FIG. 6B) of the half-blanked portion 605a, with the recessed region 617 press-fit onto the recessed region 607.

Referring to FIG. 6C, the leadframe of FIG. 6B (including the leadframe portion 605 and the contiguous half-blanked portion 610a and heat spreader portion 610d) can be inverted (from the view of FIG. 6B) and placed in a support block (jig) 660. As shown in FIG. 6C, the heat spreader portion 610d can have apertures 665 defined therein, that allow portions of the support block 660 to extend through the heat spreader portion 610d to support, e.g., the die pad 623, the signal lead 605b and the signal lead 605d. In other words, the support block 660 can be configured to provide support to the various elements of the leadframe of FIG. 6B during additional processing operations. For example, as shown in FIG. 6C, with the leadframe in the support block 660, semiconductor die 622 and 624 can be coupled with the leadframe (e.g., using a die attach material) as shown in FIG. 6C. For instance, the die 622 can be coupled with a bottom 609 of the recessed region 607, while the die 624 can be coupled with the die pad 623. As also shown in FIG. 6C, electrical connections, such as wire bonds 630, 632 and 634, can be made between the semiconductor die 622 and 624, and the signal terminal 605b, 605c and/or 605d, such as shown.

Figure 7A:
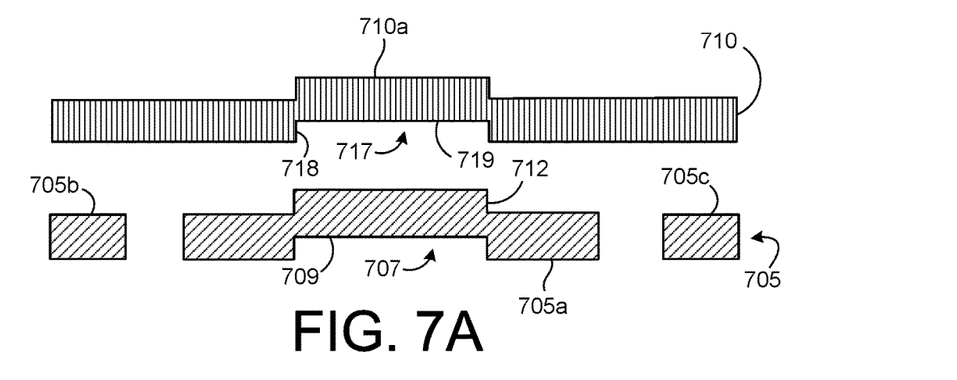
FIGS. 7A-7C are schematic, side-view diagrams illustrating operations of a manufacturing process for producing still another semiconductor device package assembly including a leadframe with efficient heat dissipation characteristics.
Figure 7B:
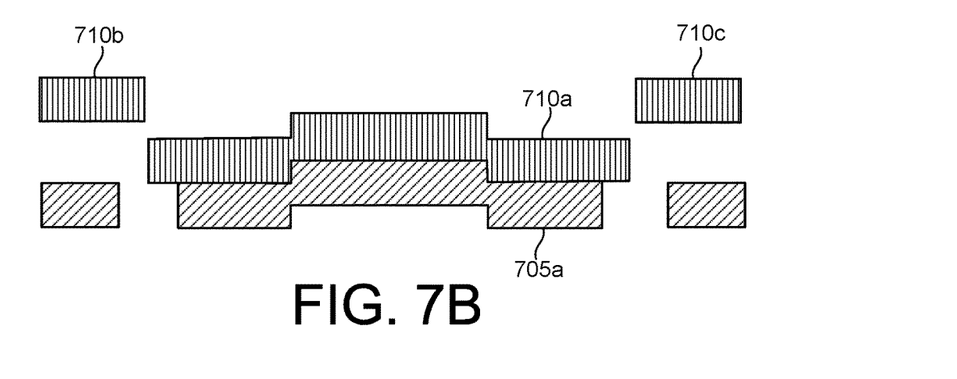
Figure 7C:
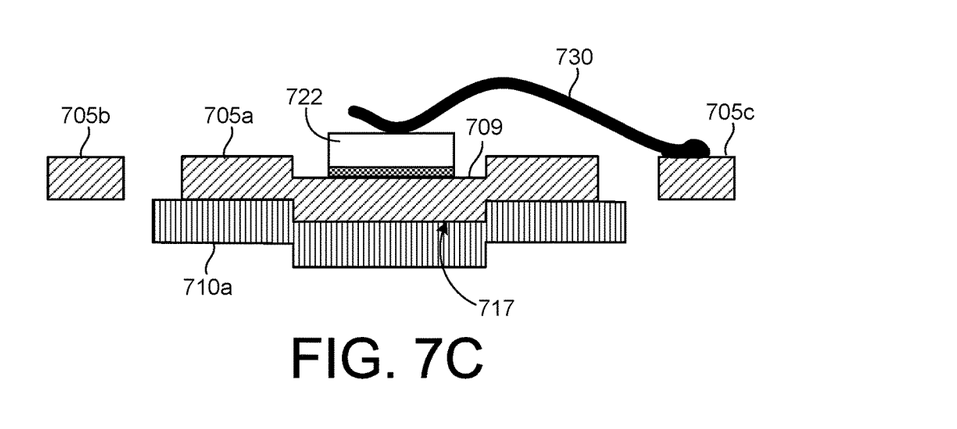

FIGS. 7A-7C are schematic diagrams illustrating operations of a manufacturing process for producing still another semiconductor device package assembly including a leadframe with efficient heat dissipation characteristics. Referring to FIG. 7A, a sheet of leadframe material 710 and a leadframe portion 705 are shown. As illustrated in FIG. 7A, the leadframe material 710 can include a half-blanked portion 710a. The half-blanked portion 710a can include a recessed region 717, which can be similar to other recessed regions described herein, and include a sidewall 718 and a bottom 719 (or top, depending on orientation). Also shown in FIG. 7A, the leadframe portion 705, similar to the leadframe portions 105, 505 and 605, includes a half-blanked portion 705a, a signal terminal 705b and a signal terminal 705c. In the example of FIG. 7A, the half-blanked portion 705a includes a recessed region 707, which can be similar to the other recessed regions described herein.

As illustrated in FIG. 7B, the half-blanked portion 710a can be formed from the leadframe material 710, leaving portions 710b and 710c as residue (which can be scrap, or can be used for other purposes, such as forming additional leadframe portions). In some implementations, while not specifically shown in FIG. 7B, the half-blanked portion 710a can be formed from the leadframe material 710 using a stamping tool and die (to align the stamping tool), such as using a similar process as illustrated in FIGS. 3G-3I. The tool used to form the half-blanked portion 710a from the leadframe material 710 can also be configured to press-fit the recessed region 717 of the half-blanked portion 710a onto the recessed region 707 of the half-blanked portion 705a (e.g., onto a top surface, or top side of the recessed region 707 as shown in FIG. 7B).

As shown in FIG. 7B, the recessed region 717 of the half-blanked portion 710a can be press-fit onto the top side of the recessed region 707 (as shown in FIG. 7B), such that an upper (top, etc.) surface of the recessed region 707 is in contact (e.g., direct contact, physical contact, etc.) with the bottom 719 of the recessed region 717 (or could be referred to as a ceiling of the recessed region 717 in the view of FIG. 7B). In some implementations, the half-blanked portion 705a can be retained in the recessed region 717 by mechanical forces that are present (e.g., as a result of press-fitting) between an outer surface (e.g., an outer edge, an outer perimeter edge, etc.) 712 of the half-blanked portion 705a and an inner surface of the sidewall 718, the outer surface 712 of the recessed region 707 being in contact (e.g., physical contact, direct contact, etc.) with the inner surface of the sidewall 718.

As also shown in FIG. 7B, the half-blanked portion 710a can be disposed on (extend along, etc.) an upper surface of the half-blanked portion 705a. In another words, the half-blanked portion 710a can, at least partially, cover an upper surface (as shown in FIG. 7B) of the half-blanked portion 705a, with the recessed region 717 press-fit onto the recessed region 707.

Referring to FIG. 7C, the leadframe of FIG. 7B (including the leadframe portion 705 and the half-blanked portion 7) can be inverted (from the view of FIG. 6C) and, in some implementations, placed in a support block, or jig (not shown in FIG. 7C). As illustrated in FIG. 6C, (e.g., with or without the leadframe in a support block), semiconductor die 722 be coupled with the leadframe (e.g., using a die attach material) as shown in FIG. 7C. For instance, the die 722 can be coupled with a bottom 709 of the recessed region 707. As also shown in FIG. 7C, electrical connections, such as a wire bond 730, can be made between the semiconductor die 622 and the signal terminal 705c and/or the signal terminal 705b (connection not specifically shown in FIG. 7C).

In the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown (e.g., in the drawings) as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Galium Arsenide (GaAs), Galium Nitride (GaN), and/or so forth.

While certain features of the described implementations have been illustrated as described herein, many modifications, substitutions, changes and equivalents will now occur to those skilled in the art. The appended claims are intended to cover all such modifications and changes as fall within the scope of the implementations. The example implementations described herein and shown in the drawings have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device package assembly comprising:
   a first leadframe portion, the first leadframe portion having a recessed region defined therein, the recessed region having a sidewall and a bottom; and
   a second leadframe portion that is press-fit into the recessed region, such that a bottom surface of the second leadframe portion is in contact with the bottom of the recessed region,
   the second leadframe portion being retained in the recessed region by mechanical force between an outer surface of the second leadframe portion and an inner surface of the sidewall, the outer surface of the second leadframe portion being in contact with the inner surface of the sidewall.

2. The semiconductor device package assembly of claim 1, wherein:
   the first leadframe portion is formed from a first metal sheet having a first uniform thickness; and
   the second leadframe portion is formed from a second metal sheet having a second uniform thickness.

3. The semiconductor device package assembly of claim 2, wherein the first uniform thickness is approximately equal to the second uniform thickness.

4. The semiconductor device package assembly of claim 1, wherein the bottom defines a plane, the sidewall being orthogonal with the plane.

5. The semiconductor device package assembly of claim 1, wherein a perimeter of the second leadframe portion corresponds with a perimeter of the recessed region, the surface of the second leadframe portion that is in contact with the sidewall being an outer edge of the second leadframe portion, the sidewall defining the perimeter of the recessed region.

6. The semiconductor device package assembly of claim 1, the second leadframe portion including at least one heat-radiating fin.

7. The semiconductor device package assembly of claim 1, wherein the second leadframe portion includes a recessed region defined therein, the recessed region of the second leadframe portion being press-fit into the recessed region of the first leadframe portion.

8. The semiconductor device package assembly of claim 1, wherein the second leadframe portion includes a recessed region defined therein, the recessed region of the first leadframe portion being press-fit into the recessed region of the second leadframe portion.

9. The semiconductor device package assembly of claim 1, wherein the recessed region is defined using a metal stamping process.

10. The semiconductor device package assembly of claim 1, wherein the second leadframe portion is press-fit into the recessed region using a metal stamping process.

11. The semiconductor device package assembly of claim 1, further comprising a semiconductor die coupled to one of:
an upper surface of the second leadframe portion; or
a bottom surface of the first leadframe portion on an underside of the recessed region of the first leadframe portion.

12. The semiconductor device package assembly of claim 11, further comprising an electrical connection between the semiconductor die and a signal terminal included in the first leadframe portion.

13. The semiconductor device package assembly of claim 12, wherein the electrical connection includes a wire bond.

14. The semiconductor device package assembly of claim 11, further comprising an electrical connection between the semiconductor die and a signal terminal included in the second leadframe portion.

15. The semiconductor device package assembly of claim 11, wherein the upper surface of the second leadframe portion is a bottom of the recessed region of the second leadframe portion.

16. A semiconductor device package assembly comprising:
a first leadframe portion, the first leadframe portion having a recessed region defined therein, the recessed region having a bottom and a sidewall, the bottom defining a plane, the sidewall being orthogonal to the plane; and
a second leadframe portion that is press-fit into the recessed region, such that:
a first portion of the second leadframe portion is disposed within the recessed region, and in contact with the sidewall and the bottom of the recessed region; and
a second portion of the second leadframe portion is disposed outside the recessed region.

17. The semiconductor device package assembly of claim 16, further comprising a semiconductor die coupled to one of:
an upper surface of the second leadframe portion; or
a bottom surface of the first leadframe portion on an underside of the recessed region.

18. The semiconductor device package assembly of claim 16, wherein the second leadframe portion includes a recessed region defined therein, the recessed region of the second leadframe portion being press-fit into the recessed region of the first leadframe portion.

19. A method comprising:
forming a recessed region in a first leadframe portion, the recessed region having a sidewall and a bottom; and
press-fitting a second leadframe portion into the recessed region, such that a bottom surface of the second leadframe portion is in contact with the bottom of the recessed region,
the second leadframe portion being retained in the recessed region by mechanical force between an outer surface of the second leadframe portion and an inner surface of the sidewall, the outer surface of the second leadframe portion being in contact with the inner surface of the sidewall.

20. The method of claim 19, wherein:
forming the recessed region includes forming the recessed region using a metal stamping process; and
press-fitting the second leadframe portion into the recessed region includes press-fitting the second leadframe portion into the recessed region using a metal stamping process.

21. The method of claim 19, further comprising:
coupling a semiconductor die to one of:
an upper surface of the second leadframe portion; or
a bottom surface of the first leadframe portion on an underside of the recessed region of the first leadframe portion.

* * * * *